(12) United States Patent
Sydorenko et al.

(10) Patent No.: US 7,851,786 B2
(45) Date of Patent: Dec. 14, 2010

(54) PROGRAMMABLE POLYELECTROLYTE ELECTRICAL SWITCHES

(75) Inventors: Oleksandr Sydorenko, Piscataway, NJ (US); Nikolai B. Zhitenev, Berkeley Heights, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 992 days.

(21) Appl. No.: 11/514,483

(22) Filed: Sep. 1, 2006

(65) Prior Publication Data

US 2008/0054254 A1 Mar. 6, 2008

(51) Int. Cl.
*H01L 29/08* (2006.01)

(52) U.S. Cl. .................. 257/40; 257/529; 257/E29.325

(58) Field of Classification Search ............. 257/29–42, 257/E29.325; 365/129, 148–153; 429/303
See application file for complete search history.

(56) References Cited

U.S. PATENT DOCUMENTS

| | | | |
|---|---|---|---|
| 6,686,263 B1 * | 2/2004 | Lopatin et al. ............... | 438/584 |
| 7,321,503 B2 * | 1/2008 | Joo et al. ..................... | 365/148 |
| 7,405,167 B2 * | 7/2008 | Kang et al. .................. | 438/780 |
| 7,507,469 B2 * | 3/2009 | Mao et al. ................. | 428/319.3 |
| 2002/0163057 A1 * | 11/2002 | Bulovic et al. .............. | 257/529 |
| 2006/0141703 A1 | 6/2006 | Kang et al. .................. | 438/250 |
| 2006/0172909 A1 * | 8/2006 | Schmiedel et al. .......... | 510/267 |

FOREIGN PATENT DOCUMENTS

EP    1 594 176 A1   11/2005
EP    1 598 877 A1   11/2005
WO    WO 2006/104858 A1   10/2006

OTHER PUBLICATIONS

PCT International Search Report dated Feb. 15, 2008 (PCT/US2007/018814) 5 pages.

Ma, D. et al., "Organic Reversible Switching Devices for Memory Applications," Advanced Materials, vol. 12, No. 14, pp. pp. 1063-1066 (Jul. 19, 2000).

Chu, C.W. et al., "Organic Donor-Acceptor System Exhibiting Electrical Bistability for Use in Memory Devices," Advanced Materials, vol. 17, pp. 1440-1443 (2005).

Ma, L. et al., "Organic nonvolatile memory by controlling the dynamic copper-ion concentration within organic layer," Applied Physics Letters, vol. 84, No. 24, pp. 4908-4910 (Jun. 14, 2004).

Smith, S. et al., "A low switching voltage organic-on-inorganic heterojunction memory element utilizing a conductive polymer fuse on a doped silicon substrate," American Institute of Physics, Applied Physics Letters, vol. 84, No. 24, pp. 5019-5021, (Jun. 14, 2004).

(Continued)

*Primary Examiner*—Chandra Chaudhari
(74) *Attorney, Agent, or Firm*—Hitt Gaines, PC

(57) ABSTRACT

An apparatus includes a first solid electrode on a substrate, a polyelectrolyte layer over a part of the first solid electrode, a second solid electrode on a portion of the polyelectrolyte layer, and an anchoring layer on the part of the first solid electrode. The polyelectrolyte layer is either chemically bonded to the anchoring layer or has a thickness of less than about 20 nanometers.

13 Claims, 8 Drawing Sheets

OTHER PUBLICATIONS

Ouyang, J. et al., "Electric-field-induced charge transfer between gold nanoparticle and capping 2-naphthalenethiol and organic memory cells," Applied Physics Letters, No. 86, pp. 12357-1 to 123507-3 (2005).

Chen, J. et al., "Single-layer organic memory devices based on N, N'-di(napthalene-I-yl)-N, N'-diphenyl-benzidine," Applied Physics Letters, vol. 87, pp. 023505-1 to 023505-3 (2005).

Lauters, M. et al., "Nonvolatile multilevel conductance and memory effects in organic thin films," Applied Physics Letters, vol. 87, pp. 231105-1 to 231105-3 (2005).

Lai, Q. et al., "Organic nonvolatile memory by dopant-configurable polymer," Applied Physics Letters, vol. 88, pp. 133515-1 to 133515-3 (Apr. 2006 or earlier).

Bozano, L.D. et al., "Mechanism for bistability in organic memory elements," Applied Physics Letters, vol. 84, No. 4, pp. 607-609 (Jan. 26, 2004).

Beinhoff, M. et al., "Design and Synthesis of New Polymeric Materials for Organic Nonvolatile Electrical Bistable Storage Devices: Poly(biphenylmethylene)s," Macromolecules, vol. 38, pp. 4147-4156 (2005).

Liu, Z. et al., "Electrically Bistable Memory Device Based on Spin-Coated Molecular Complex Thin Film," IEEE Electron Device Letters, vol. 27, No. 3, pp. 151-153 (Mar. 2006).

Schroeder, R. et al., "Memory Performance and Retention of an All-Organic Ferroelectric-Like Memory Transistor," IEEE Electron Device Letters, vol. 26, No. 2, pp. 69-71 (Feb. 2005).

Ducharme, S. et al., "Ferroelectric Polymer Langmuir-Blodgett Films for Nonvolatile Memory Applications," IEEE Transacations on Device and Materials Reliability, vol. 5, No. 4, pp. 720-735 (Dec. 2005).

Bozano, L.D. et al., "Organic Materials and Thin-Film Structures for Cross-Point Memory Cells Based on Trapping in Metallic Nanoparticles," Advanced Functional Materials, vol. 15, pp. 1933-1939 (2005).

Paul, S. et al., "Memory effect in thin films of insulatng polymer and $C_{60}$ nanocomposites," Nanotechnology, vol. 17, pp. 145-151 (2005).

Bez, R. et al., "Non-volatile memory technologies: emerging concepts and new materials," Materials Science in Semiconductor Processing, vol. 7, pp. 349-355 (2004).

Majumdar, H.S. et al., "Switching and memory devices based on a polythiophene derivative for data-storage applications," Synthetic Materials, vol. 140, pp. 203-206 (2004).

Thinfilm, TF NewCo ASA, Information Memorandum, 27 pages (Apr. 11, 2006).

Zapka, W. et al., "XAAR Thinfilm: Innovative Inkjet Technology," 32 pages, (Apr. 6, 2006) Sweden.

Collier, C.P. et al., "A [2]Catenane-Based Solid State Electronically Reconfigurable Switch," Science, vol. 289, pp. 1172-1175 (Aug. 18, 2000).

Ma, L.P. et al., "Organic electrical bistable devices and rewritable memory cells," Applied Physics Letters, vol. 80, No. 16, pp. 2997-2999 (Apr. 22, 2002).

Stewart, D.R. et al., "Molecule-Independent Electrical Switching in Pt/Organic Monolayer/Ti Devices," Nano Letters, vol. 4, No. 1, pp. 133-136 (2004).

Ouyang, J. et al., "Programmable polymer thin film and non-volatile memory device," Nature Materials, vol. 3, pp. 918-922 (Dec. 2004).

Chen, J. et al., "Large On-Off Ratios and Negative Differential Resistance in a Molecular Electronic Device," Science, vol. 286, pp. 1550-1552 (Nov. 19, 1999).

Tseng, R.J. et al., "Nanoparticle-induced negative differential resistance and memory effect in polymer bistable light-emitting device," Applied Physics Letters, vol. 88, pp. 123506-1 to 123506-3, (Apr. 14, 2006 or earlier).

Brewer, J.E. et al., "Memory Technology for the Post CMOS Era," IEEE Circuits & Devices Magazine, pp. 13-20 (Mar./Apr. 2005).

Tondelier, D. et al., "Metal/organic/metal bistable memory devices," Applied Physics Letters, vol. 85, No. 23, pp. 5763-5765 (Dec. 6, 2004).

Zhitnev, N.B. et al., "Control of topography, stress and diffusion at molecule-metal interfaces," Nanotechnology, vol. 17, pp. 1272-1277 (Feb. 7, 2006).

Strukov, D.B. et al., "CMOL FPGA: a reconfigurable architecture for hybrid digital circuits with two-terminal nanodevices," Nanotechnology, vol. 16, pp. 888-900, (2005).

Bialk, M. et al., "Grafting of polymers to solid surfaces by using immobilized methacrylates," Colloids and Surfaces A, Physicochemical and Engineering Aspects, pp. 543-549 (2002).

Iyer, K.S. et al., "Polystyrene Layers Grafted to Macromolecular Anchoring Layer," Macromolecules, vol. 36, pp. 6519-6526 (2003).

Roiter, Y. et al., "AFM Single Molecule Experiments at the Solid-Liquid Interface: In Situ Conformation of Adsorbed Flexible Polyelectrolyte Chains," Journal of American Chemical Society, vol. 127, pp. 15688-15689 (2005).

Lai, Y.S. et al., "Bistable resistance switching of poly(N-vinylcarbazole) films for nonvolatile memory applications," Applied Physics Letters, vol. 87, pp. 122101-1 to 122101-3 (2005).

Zdyrko, B. et al., "Synthesis and Surface Morphology of High-Density Poly(ethylene glycol) Grafted Layers," Langmuir, vol. 19, pp. 10179-10187 (2003).

Luzinov, I. et al., "Thermoplastic Elastomer Monolayers Grafted to a Functionalized Silicon Surface," Macromolecules, vol. 33, pp. 7629-7638 (2000).

Ionov, L. et al., "Inverse and Reversible Switching Gradient Surfaces from Mixed Polyelectrolyte Brushes," Langmuir, vol. 20, pp. 9916-9919 (2004).

Minko, S. et al., "Radical Polymerization Initiated from a Solid Substrate," 2. Study of the Grafting Layer Growth on the Silica Surface by in situ Ellipsometry, Macromolecules, vol. 32, pp. 4532-4538 (1999).

Luzinov, I. et al., "Epoxy-Terminated Self-Assembled Monolayers: Molecular Glues for Polymer Layers," Langmuir, vol. 16, pp. 504-516 (1999).

Zhitenev, N., "Transport Spectroscopy of Nano- and Mesoscale Molecular Junctions," 25 pages, Low Energy Electrodynamics in Solids Conference, Tallinn, Estonia (Jul. 6, 2006).

* cited by examiner

PROGRAMMABLE POLYELECTROLYTE ELECTRICAL SWITCHES

BACKGROUND

1. Field of the Invention

The invention relates to electrical switches and to methods for making and operating electrical switches.

2. Discussion of the Related Art

This section introduces aspects that may be helpful to facilitating a better understanding of the inventions. Accordingly, the statements of this section are to be read in this light. The statements of this section are not to be understood as being admissions about what is in the prior art or about what is not in the prior art.

Significant research activity has targeted fabrication of conventional circuit devices with small lateral feature dimensions. Substantial efforts have targeted producing electrical switches and transistors with lateral feature dimensions of less than about 0.5 micrometers.

Significant research activity has also targeted fabrication of conventional circuit devices in which active layers are organic. In such devices, effects at interfaces between metallic solid electrodes and the active organic layer can control the electrical behavior of the devices.

BRIEF SUMMARY

Some embodiments of electrical switches have active organic channels that exhibit memory properties. The memory properties enable control voltages to switch the active organic channels between substantially conducting and substantially non-conducting states. The memory properties enable the active organic channels to stay in the conducting and non-conducting states after the control voltages are removed.

One embodiment features a method that includes providing a first solid electrode on a substrate, forming a polyelectrolyte layer over a part of the first solid electrode, and forming a second solid electrode on a portion of the polyelectrolyte layer. The act of forming a polyelectrolyte layer includes chemically bonding polymer molecules of the layer to an attachment region.

Another embodiment features a method that includes providing a first solid electrode on a substrate, forming a polyelectrolyte layer over a part of the first solid electrode, and forming a second solid electrode on a portion of the polyelectrolyte layer. The polyelectrolyte layer has a thickness of less than about 20 nanometers between the first and second solid electrodes.

In some embodiments of the above methods, the act of forming a second solid electrode produces the second solid electrode on a macromolecular monolayer of the polyelectrolyte over the part of the first solid electrode.

In some embodiments of the above methods, the forming a polyelectrolyte layer includes chemically bonding polymer molecules of the layer to an anchoring layer on the part of the first solid electrode.

In some embodiments, the above methods include treating the polyelectrolyte layer with a solution that includes metal ions or ammonium cations or one of pyridine, an amine, aniline, a derivative of pyridine, and a derivative of aniline.

In some embodiments, the above methods include integrating a shadow mask over a top surface of the substrate.

In some embodiments of the above methods, the forming a polyelectrolyte layer produces the layer with a thickness of less than about 12 nm.

Another embodiment features an apparatus that includes a first solid electrode on a substrate, a polyelectrolyte layer over a part of the first solid electrode, a second solid electrode on a portion of the polyelectrolyte layer, and an anchoring layer on the part of the first solid electrode. The polyelectrolyte layer is chemically bonded to the anchoring layer.

Another embodiment features an apparatus that includes a first solid electrode on a substrate, a polyelectrolyte layer over a part of the first solid electrode, and a second solid electrode on a portion of the polyelectrolyte layer. Between the two solid electrodes, the polyelectrolyte layer has a thickness of less than about 20 nanometers. The apparatus may include an anchoring layer located on the first solid electrode with the polyelectrolyte layer chemically bonded to the anchoring layer.

In some embodiments of the above apparatus, the polyelectrolyte layer is a macromolecular monolayer of polyelectrolyte molecules.

In some embodiments of the above apparatus, the layer further includes metal cations, ammonium cations, pyridine, an amine, aniline, a derivative of pyridine, or a derivative of aniline.

In some embodiments of the above apparatus, the polyelectrolyte layer has a thickness of less than about 12 nanometers between the two solid electrodes.

In some embodiments of the above apparatus, the layer has a conductivity that can be repeatedly switched between a relatively high and low conductivity states by applying voltages across the solid electrodes.

BRIEF DESCRIPTION OF THE DRAWINGS

In the Figures and text, like reference numerals indicate elements with similar functions.

In the Figures, the relative dimensions of some features may be exaggerated to more clearly illustrate one or more of the structures therein.

Herein, the term polyelectrolyte refers to a polymer that is itself an electrolyte. A polyelectrolyte has polymer molecules with functional groups that are ionizable in solvents to produce salts.

Herein, various embodiments are described more fully by the Figures and the Detailed Description of Illustrative Embodiments. Nevertheless, the inventions may be embodied in various forms and are not limited to the embodiments described in the Figures and Detailed Description of Illustrative Embodiments.

DETAILED DESCRIPTION OF ILLUSTRATIVE EMBODIMENTS

Figure 1:
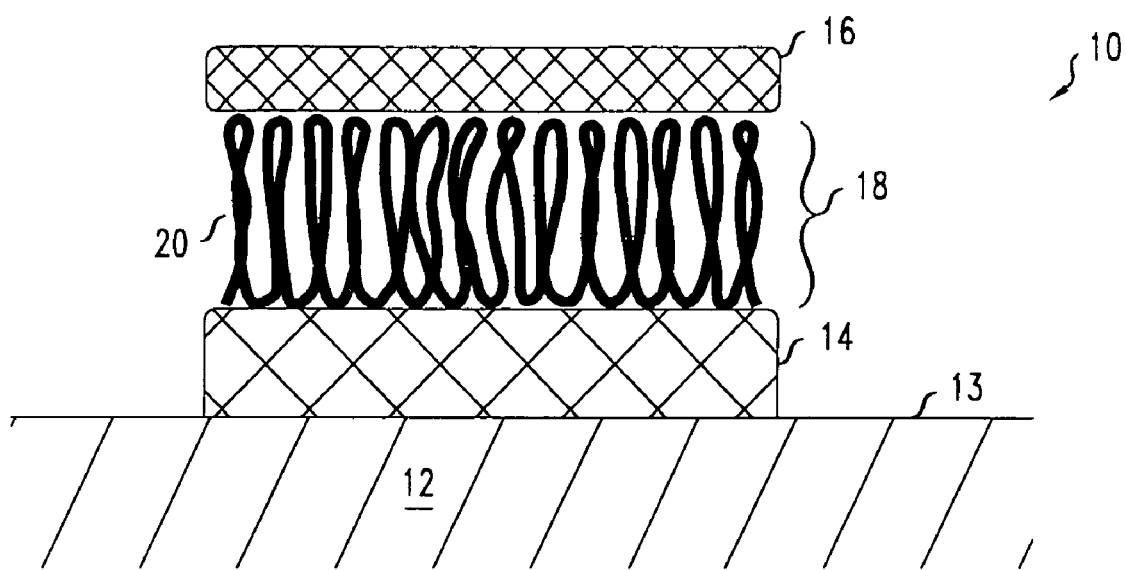
FIG. 1 is a cross-sectional view of a two-terminal electrical switch that exhibits memory behavior.

FIG. 1 shows one embodiment of a hysteresis-based electrical switch 10, i.e., a switch that exhibits memory behavior. The switch includes a substrate 12, bottom and top solid electrodes 14, 16 and a polyelectrolyte layer 18. The two solid electrodes 14, 16 and the polyelectrolyte layer 18 are located over a top surface 13 of the substrate 12. The polyelectrolyte layer 18 is interposed between and near to the top and bottom solid electrodes 14, 16 and may, in some embodiments, be chemically bonded to an attachment region over or on the bottom solid electrode 14.

In the electrical switch 10, the substrate 12 provides physical support. The substrate 12 may be, e.g., crystalline semiconductor, e.g., conventional $p^+$-doped, $n^-$-doped, or undoped crystalline silicon; a conventional dielectric substrate, e.g., a silica glass substrate; or a multilayer of dielectric and/or semiconductor. The substrate 12 may include, e.g., a dielectric layer that provides electrical insulation from the electrical switch 10.

In the electrical switch 10, each solid electrode 14, 16 may be a metal layer, a metal multilayer, or structure of another good conductor. For example, the bottom solid electrode 14 may be, e.g., a conventional metal multilayer of gold (Au) and titanium (Ti) and the top solid electrode 16 may be, e.g., an Au layer. Such a Ti layer may aid in adhering the bottom solid electrode 14 to the top surface 13 of the substrate 12. Alternately, the bottom solid electrode 14 may be a heavily doped semiconductor layer or conducting region of the substrate 12.

In the electrical switch 10, the polyelectrolyte layer 18 includes a distribution of polymer molecules 20 that substantially fill the region vertically interposed between the bottom and top solid electrodes 14, 16. The polymer molecules 20 are in contact with or near to each solid electrode 14, 16, e.g., less than 3 nanometers (nm) away and preferably less than 1.5 nm away from each solid electrode 14, 16. An exemplary polyelectrolyte layer 18 may be a macromolecular monolayer whose thickness is between about 5 nm and 20 nm, e.g., less than 12 nm or even about 8 nm.

In the polyelectrolyte layer 18, the distribution of the polymer molecules 20 causes the layer 18 to be impenetrable to vapor-deposited metal in the region over the solid electrode 14. Exemplary polyelectrolyte layers 18 include dense packings of polymer molecules 20, e.g., inter-tangled polymer brushes. Such dense packings of polymer molecules 20 can reduce the risk of producing vertical voids that might otherwise enable the production of electrical shorts during fabrication of the top solid electrode 16. In the polyelectrolyte layer 18, the diameters of any vertical voids are preferably less than about 5 nm and more preferably are less than about 1 nm in the region over the top solid electrode 14. More generally, a dense packing of the polymer molecules 20 causes the polyelectrolyte layer 18 to be impenetrable to metal that is vapor-deposited on a surface thereof.

In the polyelectrolyte layer 18, a portion or all of the polymer molecules 20 include one or more than one ionizable and/or ionic functional groups dispersed along their lengths. The ionizable and/or ionic functional groups may be, e.g., carboxylic acid groups or ions thereof. An exemplary species for the polymer molecules 20 is co-polymers of polyacrylamide-polyacrylic acid (PAm-PAAc) and/or partial or complete anions thereof. Such PAm-PAAc co-polymers may have between 50 percent and 100 number percent polyacrylic acid (PAAc) monomers and/or ions thereof and may have 50 percent or less number percent of polyacrylamide (PAm) monomers.

In the polyelectrolyte layer 18, a density or dispersion of one or more additives may be present and may or may not include a density of water or water vapor. The additives may include compounds that can form salts with polyelectrolytes or may include organic compounds that strongly hydrogen bond to carboxylic acid. Exemplary compounds that can form salts with polyelectrolytes include compounds such as aniline and ions. The ions may be cations such as ammonium cations, e.g., $NH_4^+$, $N(CH_3)_4^+$, or $N(C_2H_5)_4^+$, or metal ions, e.g., $Ag^+$, $Cu^+$, $Na^+$, $Ca^+$, and $Cu^+$. Such cations can together with carboxylic anions form salts that replace some hydrogen atoms of carboxylic acid groups on the polyelectrolyte molecules. Exemplary organic compounds that can form strong hydrogen bonds to carboxylic acid groups may include pyridine, triethlyamine, and derivatives of these compounds.

In some embodiments, the polyelectrolyte molecules of polyelectrolyte layer 18 are chemically bonded to an underlying attachment region. Such chemical bonding causes the polyelectrolyte molecules of the polyelectrolyte layer 18 to be resistant to removal by washing with solvents. The chemical bonding may involve, e.g., covalent bonding of the polyelectrolyte molecules to an attachment region above or on the bottom solid electrode 14.

Figure 2:
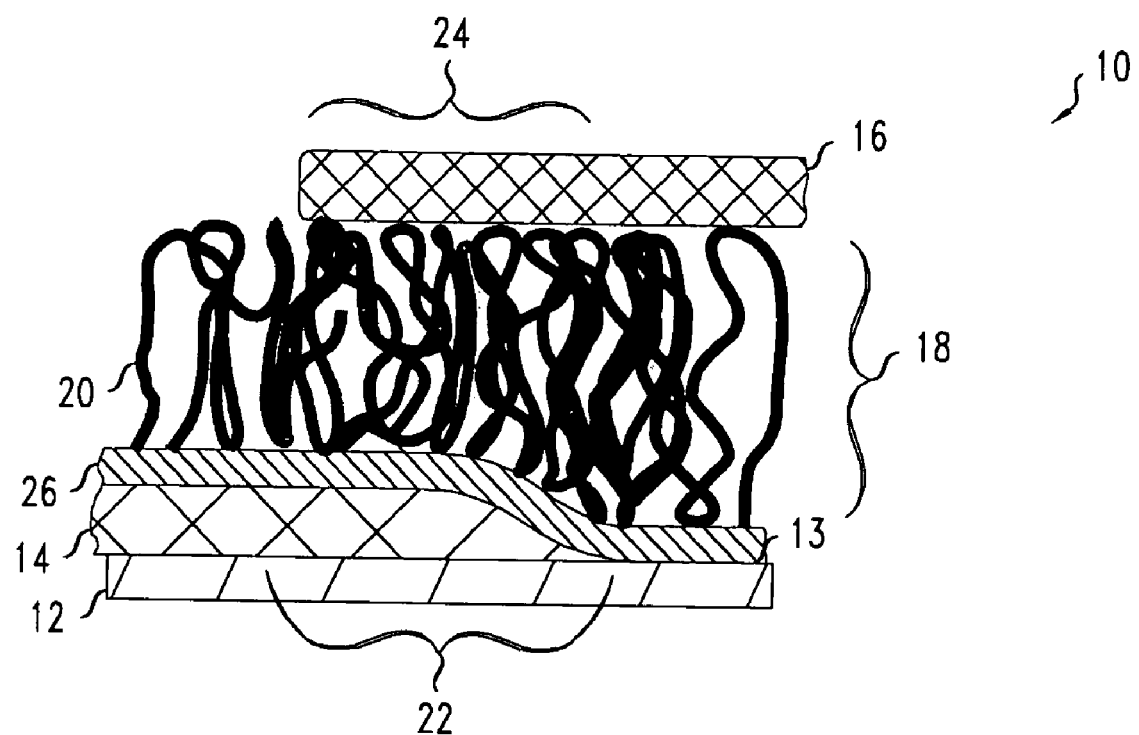
FIG. 2 illustrates a specific embodiment of the two-terminal electrical switch of FIG. 1.

FIG. 2 illustrates a specific embodiment 10' of the electrical switch 10 shown in FIG. 1. The electrical switch 10' includes a substrate 12, bottom and top solid electrodes 14, 16, and a polyelectrolyte layer 18 as described with respect to FIG. 1. In the electrical switch 10', the bottom and top solid electrodes 14, 16 are metallic, e.g., patterned Au layers or patterned Au/Ti layers. Furthermore, the bottom and top solid electrodes 14, 16 are laterally offset so that only end portions 22, 24 thereof vertically overlap. For that reason, the switching device 10' substantially confines currents to that portion of the polyelectrolyte layer 18' located between or near to the vertically aligned end portions 22, 24. Limiting the lateral extent of the vertical overlapping region of the bottom and top solid electrodes 14, 16 to said end portions 22, 24 may lower the risk of causing electrical shorting during fabrication. For example, lateral linear dimensions of the vertically overlapping region may 1 micrometer or smaller and may even be 200 nm or smaller. In particular, arrangements reduce the risk that metal atoms will cause bridging electrically shorts during a vapor-deposition of metal to form the top solid electrode 16 on a polyelectrolyte layer 18 with a thickness of 20 nm or less. The polyelectrolyte layer 18 includes polyelectrolyte molecules that are PAm-PAAc co-polymers or ions thereof and may also include additives such as metal or ammonium cations and strongly hydrogen bonding compounds as described above.

The switching device 10' also includes a thin organic anchoring layer 26 that adheres well to both the metallic bottom solid electrode 14 and to the exposed portions of the top surface 13 Of the substrate 12. The attachment layer is formed, e.g., of a poly(glycidyl methacrylate) (PGMA) polymer that may be partially cross-linked. The organic anchoring layer 26 may have a thickness of about 1.5 nm or less.

The electrolytic PAm-PAAc co-polymer molecules of the polyelectrolyte layer 18 are covalently grafted, e.g., to the molecules of the PGMA anchoring layer 26.

Figure 3:
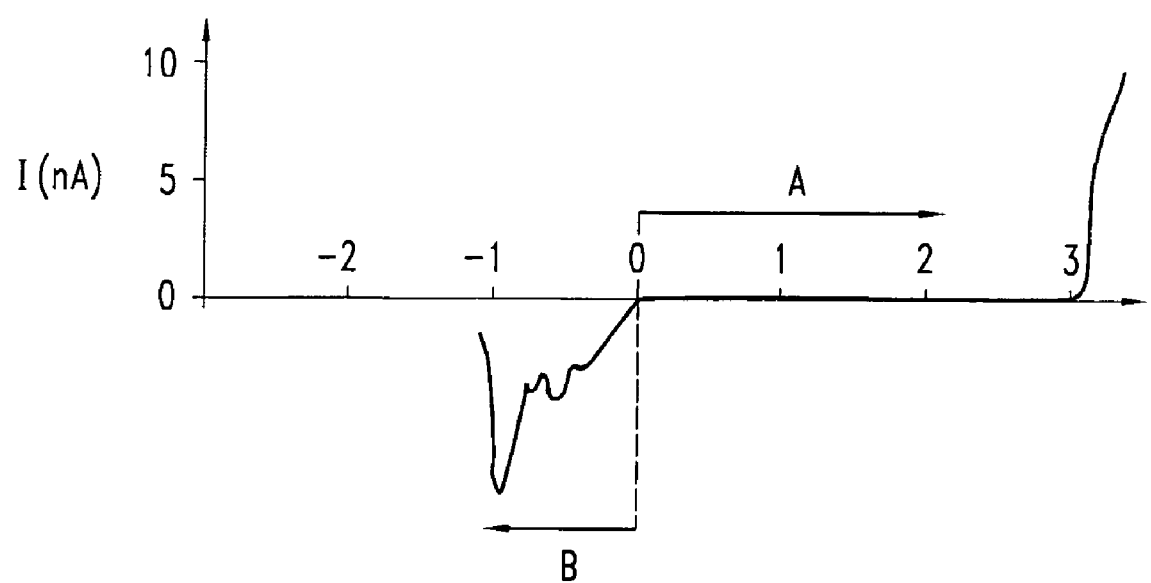
FIG. 3 schematically illustrates current/voltage (I/V) characteristics for a two-terminal electrical switch that exhibits a memory behavior, e.g., an electrical switch as in FIG. 2.
Figure 4:
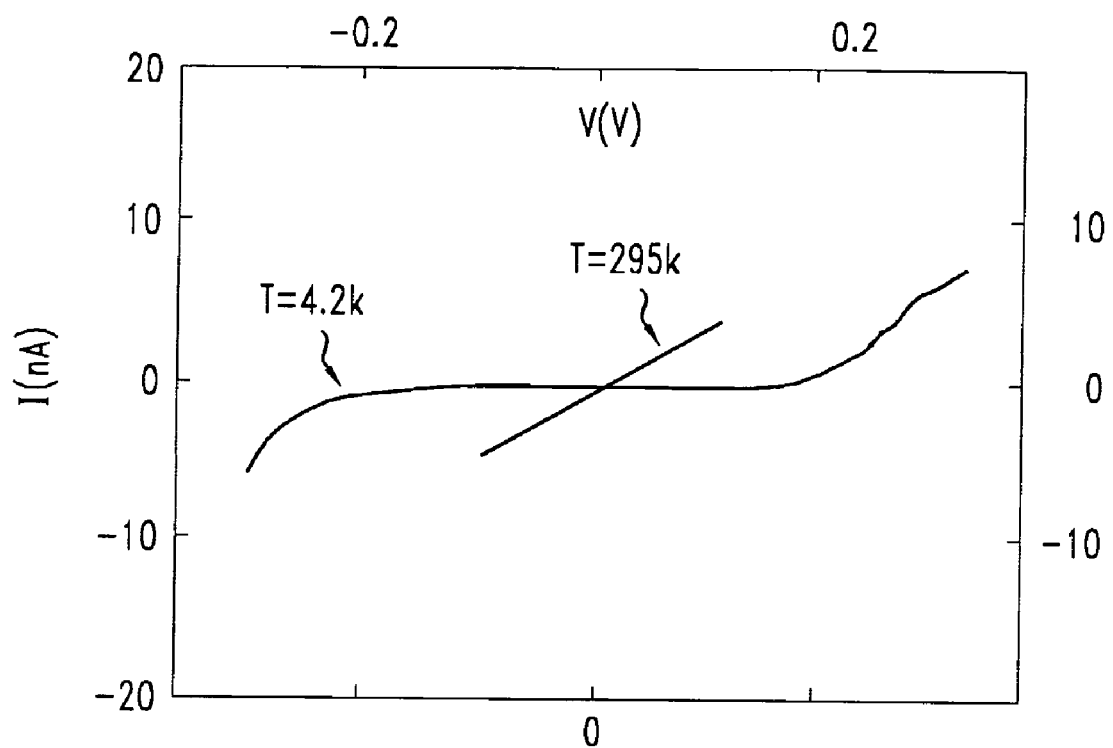
FIG. 4 schematically illustrates ON-state I/V characteristics of a two-terminal switch with a memory behavior, e.g., an electrical switch as in FIG. 2.

FIGS. 3-4 qualitatively illustrate forms of exemplary current-voltage (I./V) characteristics for the electrical switches 10, 10' described by FIGS. 1 and 2. In particular, these I./V characteristics schematically show that these electrical switches 10, 10' are based on hysteresis or a memory-behavior.

FIG. 3 shows curves A and B, which qualitatively illustrate how voltages applied across the solid electrodes 14, 16 can change the state of an active channel portion of the polyelectrolyte layer 18 in the electrical switch 10'.

Curve A qualitatively illustrates the reaction of an exemplary switching device 10' when the active channel portion is initially in a low conductivity state, i.e., OFF-state. From that state, application of a positive voltage across the bottom and top solid electrodes 14, 16 does not generate substantial current in the active channel until the applied voltage reaches a value of about 2.9 volts (V), i.e., the turn-ON threshold. Above the turn-ON threshold, the active channel portion rapidly evolves to a much higher conductivity state, i.e., the ON-state. In the exemplary electrical switch 10', the current (I) in the active channel can attain a value of more than 5 nano-amps (nA) in the ON-state. Also, subsequent removal of the applied voltage does not return the active channel portion to the relatively lower conductivity OFF-state. That is, the active channel has a memory behavior or exhibits hysteresis.

Curve B qualitatively illustrates the reaction of the exemplary switching device 10' when the active channel portion is initially in the relatively high conductivity state, i.e., the ON-state. From that state, the application of small voltages across the solid electrodes 14, 16 do not return the active channel portion of the electrical switch 10' to the OFF-state. But, as the applied voltage grows to larger negative values, i.e., about −1 volts, the resistivity of the active channel portion suddenly and rapidly increases and the current there across rapidly drops. That is, the large magnitude voltage of sign opposite to the turn-ON voltage returns the electrical switch 10' to the OFF-state. In the OFF-state, the active channel portion does not carry significant current due to its high resistance. The OFF-state persists as long as the magnitude of applied voltages remains significantly below the turn-ON threshold.

FIG. 4 schematically illustrates the response of one switching device 10' to small applied voltages when in the ON-state at temperatures of 4.2 kelvin (K) and 295 K. At the low temperature of 4.2 K, the application of a small voltage, e.g., less than about 0.1 V, does not produce substantial conduction in the active channel portion of the polyelectrolyte layer 18 even though it is in the ON-state. Near room temperature, e.g., 295 K, the application of similar small voltages generates much more substantial currents in the active channel portion. Thus, the active channel portion appears to have a current carrier density that is thermally excited. At both temperatures, the reaction of the active channel portion of the polyelectrolyte layer 18 does not exhibit hysteresis for such small applied voltages.

Figure 5:
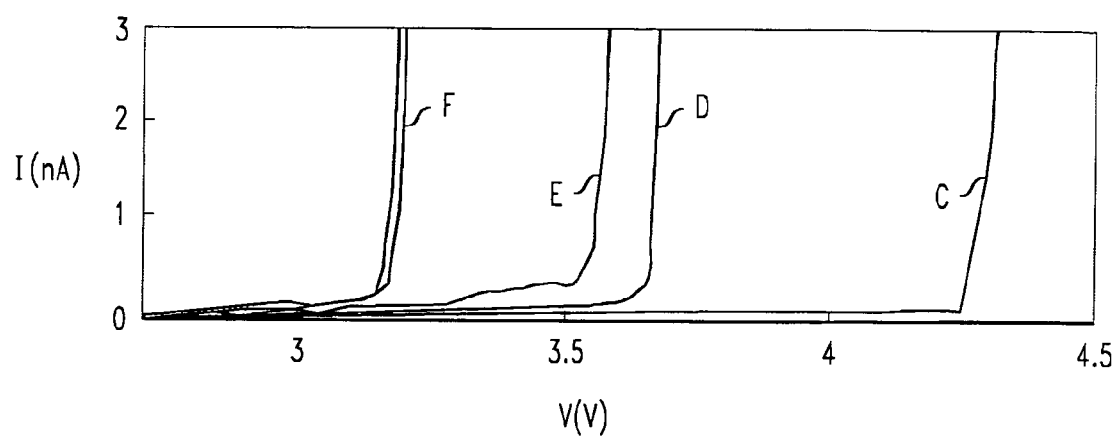
FIG. 5 shows I/V characteristics for an electrical switch with memory behavior, e.g., an electrical switch as in FIG. 2, after various chemical treatments of the polyelectrolyte layer therein.

FIG. 5 illustrate how the turn-ON voltage of one electrical switch 10' as described by FIG. 2, responds to treatments of the polyelectrolyte layer 18 with additives such as cations and strongly hydrogen bonding compounds. When the switch's polyelectrolyte layer 18 is a PAm-PAAc co-polymer, the C curve shows the turn-ON characteristic of the electrical switch 10'. The two "F" curves show the turn-ON characteristics of the same electrical switch 10' after treatments with $NH_4^+$ ions, i.e., after exposures to aqueous solutions of $NH_4Cl$ and $NH_4OH$, respectively. The ammonium cations substantially reduce the turn-ON voltage to about 3.2 volts. The E curve shows the turn-ON characteristic of the same electrical switch 10' after exposure of the active channel portion to pyridine, e.g., exposure to a solution of 1 weight percent (wt %) pyridine in methanol for 10-30 minutes. The E curve show that the treatment with the strongly hydrogen bonding compound pyridine also substantial reduces the turn-ON voltage to about 3.5 volts. The D curve shows the turn-ON characteristic of the electrical switch 10' after exposure of the active channel portion to triethylamine, e.g., exposure to a solution of 1 wt % triethylamine in methanol for 10-30 minutes. The presence of this second strongly hydrogen bonding compound substantial reduces the turn-ON voltage to about 3.7 volts. Thus, treating the active channel portion of the electrical switch 10' with cations and strongly hydrogen bonding compounds can reduce the turn-ON threshold.

The I/V characteristics of FIGS. 3 and 4 suggest a method 30 of operating electrical switches with qualitatively similar behaviors, e.g., the electrical switches 10, 10' as shown in FIGS. 1-2. The method 30 uses the memory behavior of electrical devices with two solid electrodes and a thin polyelectrolyte layer, wherein an active channel portion of the polyelectrolyte layer is interposed between the solid electrodes. The method 30 enables the transmission of analog or digital data through such devices.

Figure 6:
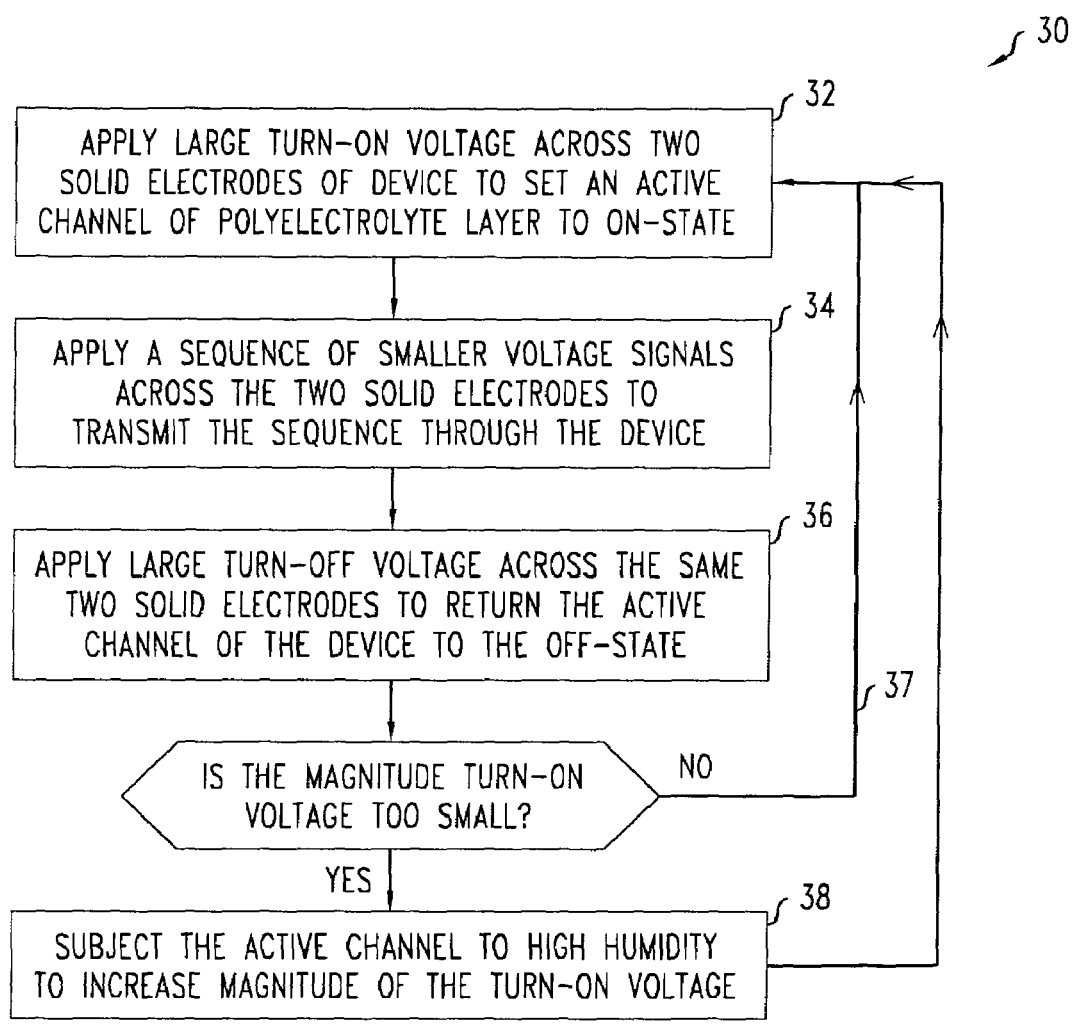
FIG. 6 is a flow chart that illustrates a method of operating a two-terminal electrical switch that exhibits memory behavior, e.g., an electrical switch as in FIGS. 1-2.

Referring to FIG. 6, the method 30 includes applying a turn-ON voltage across the two solid electrodes of the device to set the active channel portion of the polyelectrolyte layer to a high conductivity state, i.e., an ON state (step 32). The turn-ON voltage typically has a large magnitude so that it produces a very strong electric field in the thin polyelectrolyte layer of the device. The applicants believe that the very strong electric field causes physical rearrangements in strongly ionizable functional groups of polyelectrolyte molecules thereby changing the conductivity state of the active channel portion of the polyelectrolyte layer. The method 30 also includes applying a sequence of voltage signals across the same two solid electrodes to transmit a corresponding sequence of electrical signals through the device (step 34). The voltage signals of the sequence have an alternating current component (AC) and may or may not have a direct current (DC) component. The AC component of the sequence transmits data through the device. The differences between the voltage signals of the sequence are substantially smaller in magnitude than the turn-ON voltage so that the voltage signals do not cause the active channel portion to revert to the OFF-state. The voltage signals of the sequence may have, e.g., much smaller magnitudes than the turn-ON voltage, e.g., as in FIG. 4. The method 30 includes applying a large magnitude turn-OFF voltage across the two solid electrodes of the device to cause the active channel portion therein to return to the low conductivity state, i.e., the OFF-state (step 36). The sign of the turn-OFF voltage is opposite to the sign of the turn-ON voltage and has a larger magnitude than the AC components of the voltage signals used to transmit the sequence of data through the device at step 34. For example, the magnitude of the turn-ON and turn-OFF voltages may be comparable, e.g., differing by less than a factor of five or ten. The method 30 includes looping back 37 and repeating steps 32, 34, and 36 several times. Such looping back may be performed in a system in response to a determination that new data should be sent through the electrical device, i.e., a new sequence of voltage signals having an AC component.

After making many transitions between the ON and OFF states, the turn-ON thresholds of some embodiments of the electrical switches 10, 10' of FIGS. 1-2 can become small, because the resistance of OFF state becomes small. Then, a small threshold voltage may be able to cause a change of the state of the electrical switch thereby interfering with its use to transmit a data sequence via application of a sequence of corresponding AC voltage signals there across. That is, the data-carrying voltages signals of the sequence may finally be able to cause such a switch to make a transition between the ON-state and the OFF-state. For that reason, the method 30 may include subjecting the active channel portion of the device to high humidity after looping back 37 a plurality of times (step 38). Subjecting the active channel portion to high humidity may be performed, e.g., by dipping the device in water. The exposure to high humidity can increase the resistance of the electrical switch in the OFF-state so that such a sequence of small magnitude voltage signals will not cause the electrical switch to turn off. After performing such a treatment, steps 32, 34, and 36 can be repeated to transmit more data through the electrical switch.

Figure 7:
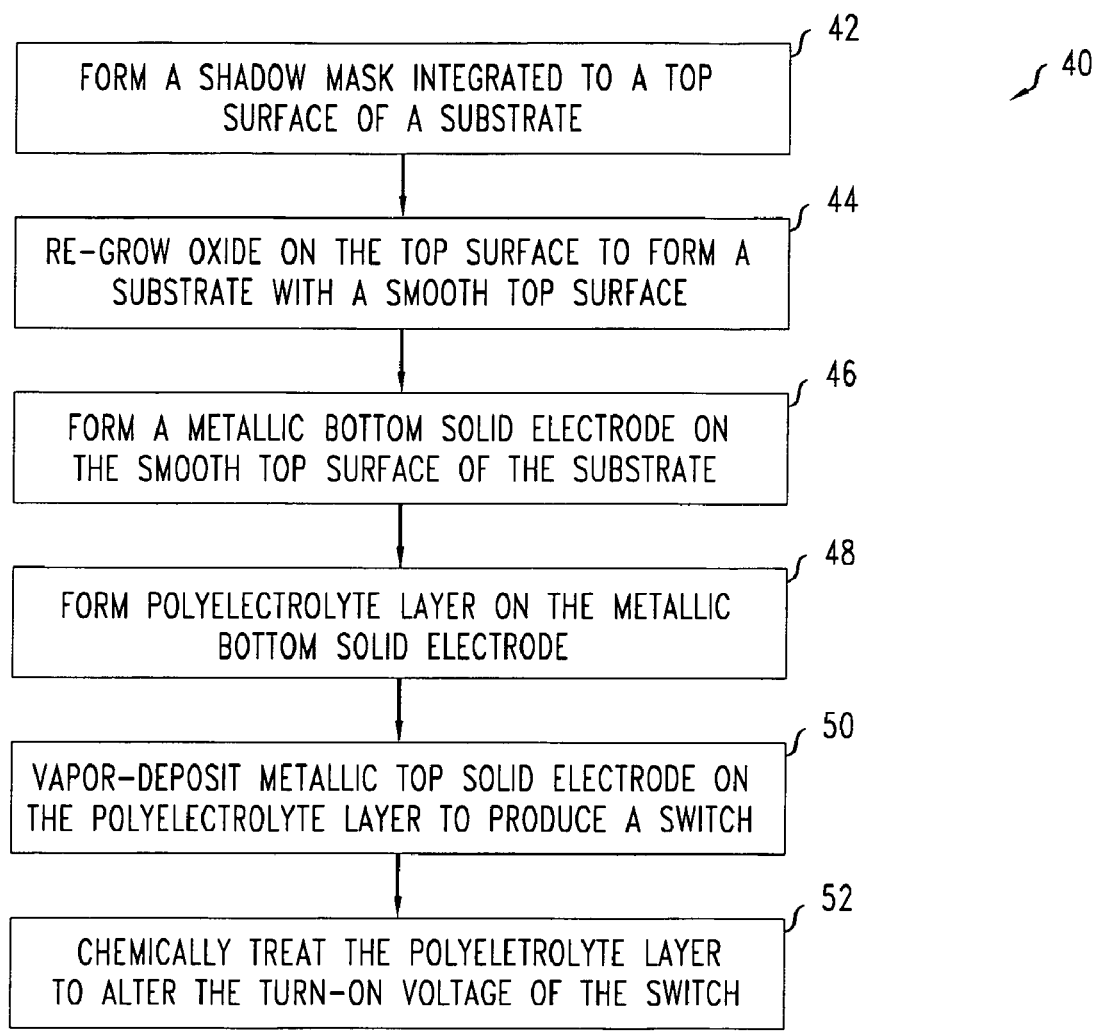
FIG. 7 is a flow chart illustrating a method of manufacturing a two-terminal electrical switch that has a polyelectrolyte channel, e.g., an electrical switch as in FIGS. 1 and 2.

FIG. 7 illustrates a method 40 for manufacturing a two-electrode electrical switch having a thin polyelectrolyte layer. The method 40 may produce an electrical switch 10, 10' as described in FIGS. 1-2.

The method 40 includes forming a shadow mask that is physically integrated to a substrate on which the switch will be fabricated, e.g., the substrate 12 of FIGS. 1-2 (step 42). The forming step 42 produces a shadow mask that is both rigidly fixed to the substrate and is very close to a top surface thereof, e.g., the surface 13.

Figure 8:
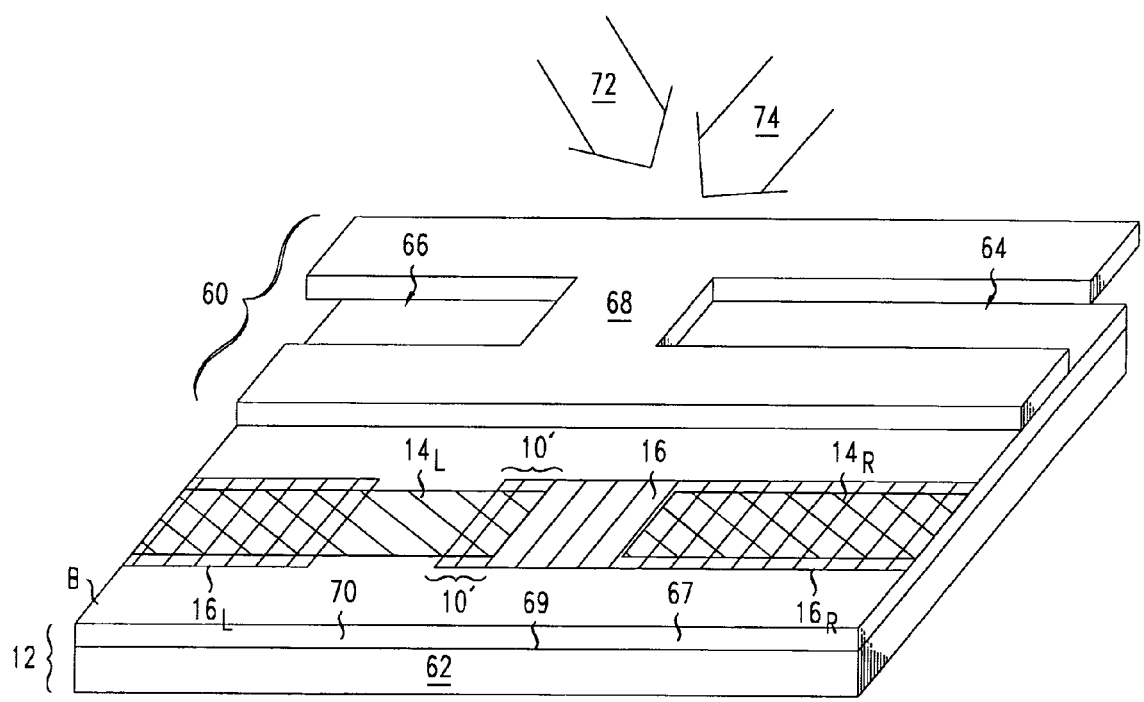
FIG. 8 illustrates placement of a shadow mask structure that may be used to manufacture a specific embodiment of the electrical switch of FIG. 2.

In some embodiments, the forming step 42 produces an exemplary shadow mask 60 of FIG. 8 via a multi-step process. The multi-step process includes performing conventional deposition process to form a $SiO_2$ isolation layer (not shown) on a top surface of a crystalline Si wafer-substrate 62. The multi-step process includes removing the $SiO_2$ isolation layer via any conventional process know to those in the art to produce a window region. The oxide-free window region is the area where the switching device will be formed. The remaining part of the $SiO_2$ isolation layer functions to electrically insulate the rest of the crystalline Si wafer-substrate 62. The multi-step process includes performing a conventional deposition to produce a thin $Si_3N_4$ layer over the top surface 13 of the substrate 12 in the window region. The $Si_3N_4$ may have, e.g., a thickness of about 400 nm. The multi-step process includes performing a conventional deposition to form a thin, high quality, $SiO_2$ layer on the $Si_3N_4$ layer. The $SiO_2$ layer may have a thickness of about 150 nm and will be used to form the mask itself. The multi-step process includes performing a conventional mask-controlled dry etch to pattern the desired shadow mask 60 into the $SiO_2$ layer. The shadow mask 60 includes two slits 64, 66 and a thin $SiO_2$ bridge 68 that separates the ends of the slits 64, 66. Next, the multi-step process includes performing a conventional second etch to selectively remove the portion of the $Si_3N_4$ that is located under the slits 64 66, and the $SiO_2$ bridge 68. The conventional second etch has a chemistry that selectively removes $Si_3N_4$ and also undercuts the $SiO_2$ bridge, e.g., because the second etch is a wet etch. The second etch is controlled to stop on the material of the top surface of the substrate 12. The second etch is also stopped prior to removal of the $Si_3N_4$ layer over all parts of the top surface 13. Thus, the remainder of the $Si_3N_4$ layer rigidly fixes the $SiO_2$ mask 60 to the top surface 13 of the substrate 12 thereby producing a physically integrated shadow mask.

The method 40 includes performing a conventional process to re-grow a thin, high quality $SiO_2$ layer, e.g., a 10 nm thick layer 67 as shown in FIG. 8, on the exposed top surface 69 of the crystalline silicon wafer-substrate (step 44). The thin regrown $SiO_2$ layer 67 provides a smooth top surface, i.e., the top surface 13.

The method 40 includes forming a metal bottom solid electrode 14 on the top surface of the substrate, e.g., the top surface 13 of the $SiO_2$ layer 67 formed at step 44 (step 46). An exemplary forming step 46 involves performing two vapor-depositions of metal. Each vapor-deposition is controlled by a shadow mask, e.g., the shadow mask 60 of FIG. 8. The first vapor-deposition may deposit a titanium (Ti) adhesion layer onto the top surface 13 of the substrate 12, i.e., a layer that may also increase the conductance of the bottom solid electrode 14. Exemplary Ti adhesion layers may have thicknesses of between 2 nm and 20 nm thick, e.g., a thickness of about 15 nm. The second vapor-deposition may deposit between 3 nm and 30 nm of gold (Au) on the Ti adhesion layer, e.g., less than 15 nm of Au or even about 5 nm of Au.

In the step 46, both vapor-depositions may be controlled by the integrated shadow mask 60 of FIG. 8. To use the shadow mask 60, each vapor-deposition is performed so that the evaporated metal atoms remain hot and do not thermalize prior to their deposition. For example, pressures are maintained so that the mean free paths of evaporated metal atoms are larger than the distance between the shadow mask 60 and the top surface 13 of the substrate 12. Thus, the vapor-depositions are ballistic processes, which produce two metal strips $14_L$, $14_R$ separated by a metal-free gap on the top surface 13 of the substrate 12 as shown in FIG. 8. During each vapor-deposition, the metal sources (not shown) are located to one side of the bridge 68. e.g., to the left of the bridge 68. Then, the beam 72 of evaporated metal atoms will produce a metal-free gap laterally offset from the centerline of the bridge 68 rather than vertically there below, i.e., a gap separating the two metal strips $14_L$, $14_R$.

Referring again to FIG. 7, the method 40 includes forming a polyelectrolyte layer on the metal bottom solid electrode, e.g., the metal strip $14_L$ (step 48). The polyelectrolyte layer may be a macromolecular monolayer in which polyelectrolyte brushes inter-tangle, e.g., as in the polyelectrolyte layers 18 of FIGS. 1-2. Part of the polyelectrolyte layer may be located on the exposed part of the top surface of the substrate, e.g., the top surface 13 of FIGS. 1-2 and 8.

With respect to step 48, one exemplary process for forming the polyelectrolyte layer is described below. The exemplary process includes two substeps. The first substep forms the thin PGMA anchoring layer 26 of FIG. 2, on the bottom solid electrode 14 and exposed part of the top surface 13 of the substrate 12. The second substep forms the polyelectrolyte layer 18 by grafting PAm-PAAc co-polymer to the PGMA anchoring layer 26.

The first substep to make the PGMA anchoring layer 26 involves performing a sequence of steps. The first step of the sequence includes depositing PGMA onto the metallic bottom solid electrode 14 and the exposed part of the top surface 13 of the substrate 12 from a solution. The solution has, e.g., about 1 weight percent (wt %) PGMA and about 99 wt % of the organic solvent methylethylketone (MEK). The resulting PGMA layer may have a thickness of 0.5 nm to 2 nm, e.g., about 1.3 nm, on the top surface 13 of the substrate 12. The second step of the sequence includes annealing the deposited PGMA, e.g., by subjecting it to a temperature of about 110° C. for about 10 minutes. The anneal may chemically bond the PGMA to the underlying surface 13 and metal bottom solid electrode 14 and/or may cross-link the PGMA via a chemical reaction between glycidyl groups thereof and trace water. Both effects can improve the physical stability of the resulting anchoring layer 26. The third step of the sequence includes treating the surface of the PGMA anchoring layer 26 to be more reactive, i.e., so that the polyelectrolyte can be grafted to the PGMA anchoring layer 26. An exemplary treatment involves subjecting the deposited PGMA to pure acrylic acid for about 10 minutes. The exemplary treatment is believed to cause carboxyl groups of acrylic acid to react with glycidyl groups of the PGMA thereby producing reactive double carbon bonds in the PGMA. The fourth step of the sequence includes washing the resulting intermediate structure to remove undesired reactants, e.g., by immersing the intermediate structure in water.

The second substep to graft PAm-PAAc co-polymer to the PGMA anchoring layer 26 also involves a sequence of steps. The first step of the sequence includes coating the PGMA anchoring layer 26 with an aqueous solution that includes precursors of the PAm-PAAc co-polymer. One such aqueous solution has about 1 wt % of a photo-initiator, e.g., 2-hydroxy-4'-(2-hydroxyethoxy)-2-methylpropiophenone, and about 20 wt %-40 wt % of the precursors for the PAm-PAAc co-polymer. Suitable precursors for the PAm-PAAc co-polymer include acrylamide and acrylic acid monomers. The second step of the sequence includes exposing the coating aqueous solution to ultraviolet (UV) light to photo-initiate polymerization therein. The exposing step may include covering the coating solution with a quartz slide and then, illuminating the quartz slide with UV light from a mercury vapor lamp. One adequate mercury vapor lamp is the model B-100, BlakRay lamp that is manufactured by UVP Inc. of Upland, CA, USA. The BlakRay lamp may be placed about 50 cm from the quartz slide, and the UV light exposure may be performed for about 1 hour to produce a PAm-PAAc co-polymer layer 18 whose thickness is between 5 nm and 20 nm, e.g., 8 nm. The third step of the sequence involves washing the layer of grafted PAm-PAAc co-polymer with water to remove remaining reactants. Due to the chemical bonds the anchoring layer 26, e.g., covalent bonds, the washing step will not remove the polyelectrolyte layer 18.

The method 40 includes vapor-depositing a metal top solid electrode on the PAm-PAAc co-polymer layer to produce an electrical switch, e.g., to produce the top solid electrode 16 of FIG. 2 (step 50). The vapor-deposition produces, e.g., a Au layer with a thickness of between 12 nm and 30 nm on the PAm-PAAc co-polymer layer 18. The deposition is performed so that the production of metal shorts between the metallic top and bottom solid electrodes, e.g., solid electrodes $14_L$, $16_R$ of FIG. 8, is avoided.

In the step 50, the vapor-depositions may be controlled by the same integrated shadow mask 60 of FIG. 8. To use the shadow mask 60, the vapor-deposition is again performed under ballistic conditions. For example, the mean free paths of evaporated metal atoms are larger than the distance between the shadow mask 60 and the top of the PAm-PAAc co-polymer layer 18. For that reason, the deposited Au forms an image of the slits 64, 66 in the shadow mask 60 as shown in FIG. 8. The image includes two Au strips $16_L$, $16_R$ and a metal-free gap laterally separating the Au strips $16_L$, $16_R$. During this deposition, the Au vapor source is placed to the right of the bridge 68 so that the beam 74 of Au atoms has a different incidence angle on the shadow mask 60 than the beam 72 of evaporated metal atoms used during the step 46. For that reason, the gap between the bottom pair of metal strips $14_L$, $14_R$ is laterally displaced relative to the gap between the pair of top metal strips $16_L$, $16_R$. In the steps 46 and 50, locations of the metal vapor sources are selected to ensure that the end of the left bottom metal strip $14_L$ vertically overlaps the end of the right top metal strip $16_R$, e.g., in a lateral overlap region whose linear dimensions may be one micrometer or less or even 200 nm or less. The lateral overlap region forms the switching device 10' as shown in FIG. 2. Forming the electrical switch in such a limited lateral overlap region can reduce the risk of electrical shorting, via penetration of the PAm-PAAc co-polymer layer 18 by deposited metal during the fabrication of the top solid electrode 16.

The method 40 may optionally include chemically treating the polyelectrolyte layer, e.g., the PAm-PAAc co-polymer layer 18 of FIG. 2, to alter its turn-ON threshold voltage, e.g., as illustrated in FIG. 5 (step 52). The treating step 52 involves subjecting the polyelectrolyte layer to a treatment solution of cations or of a strongly hydrogen bonding compound. The treating step 52 may include immersing the top surface of the switch in a treatment solution, e.g., for about 10-30 minutes and then, drying the top surface, e.g., in a nitrogen gas flow. For the cation treatments, the treatment solution may be water with about 1 wt % of ammonium ions, quaternized ammonium ions, or metal cations. Such a solution may be made by dissolving $NH_4OH$, $NH_4Cl$, $N(CH_3)_4F$, or $N(C_2H_5)_4F$ or metal salts such as $AgNO_3$, CuAc, $Cu(Ac)_2$, $CaCl_2$, NaCl in water. For the treatments with strongly hydrogen bonding compounds, the treatment solution may have about 1 wt % pyridine or triethylamine in an organic solvent such as methanol.

The chemical treatments of the step 52 may be substantially reversible. To return the turn-ON thresholds to initial values, the device may be immersed in an aqueous solution of 1 wt % acetic acid, rinsed with water, and then, dried.

From the above disclosure, the figures, and the claims, other embodiments will be apparent to those of skill in the art.

What we claim is:

1. An apparatus, comprising:
a first solid electrode on a substrate;
a layer of polyelectrolyte over a part of the first solid electrode, the polyelectrolyte being polymer that is an electrolyte;
a second solid electrode on a portion of the layer of polyelectrolyte; and
an organic anchoring layer on the part of the first solid electrode, the layer of polyelectrolyte being covalently bonded to the organic anchoring layer.

2. The apparatus of claim 1, wherein the second solid electrode is on a macromolecular monolayer of macromolecules of the layer of polyelectrolyte.

3. The apparatus of claim 1, wherein the layer of polyelectrolyte includes polymer molecules with carboxyl acid functional groups or ions of carboxylic acid functional groups.

4. The apparatus of claim 1, wherein the layer of polyelectrolyte includes acrylic acid functional groups or groups that are ions thereof.

5. The apparatus of claim 4, wherein the layer of polyelectrolyte further includes metal cations or ammonium cations dispersed therein.

6. The apparatus of claim 4, wherein the layer of polyelectrolyte includes one of pyridine, an amine, aniline, a derivative of pyridine, and a derivative of aniline.

7. The apparatus of claim 1, wherein between the first and second solid electrodes the layer of polyelectrolyte has a thickness of less than about 20 nanometers.

8. An apparatus, comprising:
a first solid electrode on a substrate;
a layer of polyelectrolyte over a part of the first solid electrode; and
a second solid electrode on a portion of the layer of polyelectrolyte layer; and
wherein the layer of polyelectrolyte includes a copolymer of polyacrylamide-polyacrylic acid between the solid electrodes the layer of polyelectrolyte has a thickness of less than about 20 nanometers.

9. The apparatus of claim 8, further comprising an anchoring layer on the part of the first solid electrode, the layer of polyelectrolyte being chemically bonded to the anchoring layer.

10. The apparatus of claim 8, wherein the layer of polyelectrolyte has a thickness of less than about 12 nanometers between the solid electrodes.

11. The apparatus of claim 8, wherein the layer of polyelectrolyte has a conductivity that can be repeatedly switched between a relatively high conductivity state and a relatively low conductivity state by applying voltages across the solid electrodes.

12. The apparatus of claim 1, wherein the organic anchoring layer includes poly(glycidyl methacrylate).

13. The apparatus of claim 8, wherein the polyacrylamide-polyacrylic acid copolymer includes between 50 and 100 number percent of polyacrylic acid monomer residues.

* * * * *